(12) United States Patent
Lee et al.

(10) Patent No.: US 8,803,222 B2
(45) Date of Patent: Aug. 12, 2014

(54) THREE-DIMENSIONAL SEMICONDUCTOR MEMORY DEVICES USING DIRECT STRAPPING LINE CONNECTIONS

(75) Inventors: Bongyong Lee, Suwon-si (KR);
Sang-Hoon Kim, Giheung-gu (KR);
Ae-Jeong Lee, Cheongju-si (KR);
Dongchan Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 5 days.

(21) Appl. No.: 13/543,312

(22) Filed: Jul. 6, 2012

(65) Prior Publication Data
US 2013/0009236 A1 Jan. 10, 2013

(30) Foreign Application Priority Data
Jul. 7, 2011 (KR) .................. 10-2011-0067478

(51) Int. Cl.
*H01L 29/792* (2006.01)
(52) U.S. Cl.
USPC ............. 257/324; 257/E29.309; 257/E29.262
(58) Field of Classification Search
USPC ........................ 257/324, E29.309, E29.262
See application file for complete search history.

(56) References Cited

U.S. PATENT DOCUMENTS

| | | | | |
|---|---|---|---|---|
| 7,309,891 B2* | 12/2007 | Yaegashi et al. | | 257/314 |
| 7,602,028 B2 | 10/2009 | Son et al. | | |
| 2009/0267128 A1 | 10/2009 | Maejima | | |
| 2009/0296476 A1 | 12/2009 | Shin et al. | | |
| 2009/0310425 A1 | 12/2009 | Sim et al. | | |
| 2010/0193861 A1 | 8/2010 | Shim et al. | | |
| 2012/0098050 A1* | 4/2012 | Shim et al. | | 257/324 |

FOREIGN PATENT DOCUMENTS

| | | |
|---|---|---|
| JP | 2008-098641 A | 4/2008 |
| JP | 2009-266945 A | 11/2009 |
| KR | 10-0806339 | 2/2008 |
| KR | 10-2009-0123476 A | 12/2009 |
| KR | 10-2009-0128776 A | 12/2009 |
| KR | 10-2010-0088829 A | 8/2010 |

* cited by examiner

*Primary Examiner* — Michael Shingleton
(74) *Attorney, Agent, or Firm* — Myers Bigel Sibley & Sajovec, P.A.

(57) ABSTRACT

Memory devices include a plurality of elongate gate stacks extending in parallel on a substrate and at least one insulation region disposed in a trench between adjacent ones of the gate stacks. The at least one insulation region has linear first portions having a first width and widened second portions having a second width greater than the first width. A common source region is disposed in the substrate underlying the at least one insulation region. The devices further include respective conductive plugs passing through respective ones of the widened second portions of the at least one insulation region and electrically connected to the common source region and at least one strapping line disposed on the conductive plugs between the adjacent ones of the gate stacks and in direct contact with the conductive plugs.

11 Claims, 27 Drawing Sheets

THREE-DIMENSIONAL SEMICONDUCTOR MEMORY DEVICES USING DIRECT STRAPPING LINE CONNECTIONS

CROSS-REFERENCE TO RELATED APPLICATIONS

This U.S. non-provisional patent application claims priority under 35 U.S.C. §119 to Korean Patent Application No. 10-2011-0067478, filed on Jul. 7, 2011, in the Korean Intellectual Property Office, the entire contents of which are hereby incorporated by reference.

BACKGROUND OF THE INVENTION

Embodiments of the subject matter relate generally to semiconductor devices and, more particularly, to three-dimensional semiconductor memory devices and methods of fabricating the same.

Due to their small size, multifunctional capabilities and/or low cost, semiconductor devices are important elements in the electronic industry. Higher integration of semiconductor devices is desired to satisfy consumer demands for superior performance and lower cost. In the case of semiconductor memory devices, since their integration is an important factor in determining product prices, increased integration is especially desirable.

In typical two-dimensional or planar semiconductor memory devices, the degree of integration is generally limited by the area occupied by a unit memory cell, which may be limited by fine pattern forming technology. In particular, the expense of process equipment needed to increase pattern fineness may act as a practical limitation on increasing integration for two-dimensional or planar semiconductor memory devices. To overcome such a limitation, there have been recently proposed three-dimensional semiconductor memory devices having multiple layers of memory cells.

SUMMARY

Some embodiments of inventive subject matter provide memory devices including a plurality of elongate gate stacks extending in parallel on a substrate, at least one insulation region disposed in a trench between adjacent ones of the gate stacks, the at least one insulation region having linear first portions having a first width and widened second portions having a second width greater than the first width. A common source region is disposed in the substrate underlying the at least one insulation region. The devices further include respective conductive plugs passing through respective ones of the widened second portions of the at least one insulation region and electrically connected to the common source region and at least one strapping line disposed on the conductive plugs between the adjacent ones of the gate stacks and in direct contact with the conductive plugs.

In further embodiments, each of the gate stacks may include a plurality of vertical channel regions distributed along a first direction. The plugs may be spaced apart along the first direction. The at least one strapping line may extend along the first horizontal direction.

The devices may further include at least one bit line electrically connected to the vertical channel regions and extending along a second direction perpendicular to the first direction. Top surfaces of the plugs may be located at a level higher than top surfaces of the vertical channel regions and lower than the at least one bit line and the at least one strapping line.

In some embodiments, the at least one insulation region may include a plurality of insulation regions disposed between respective adjacent pairs of the gate stacks, and the at least one strapping line may include a plurality of strapping lines, respective ones of which are disposed on respective ones of the insulation regions. The devices may further include a common source line electrically connected in common to the plurality of strapping lines. The common source line may be disposed at the same level as the at least one bit line. The devices may also include a barrier layer conforming to bottom and side surfaces of the at least one insulation region.

Further embodiments provide methods including forming a mold stack comprising alternately arranged sacrificial layers and insulating layers on a substrate. Vertical channel regions passing through the mold stack are formed. A trench is formed in the mold stack between adjacent rows of the vertical channel regions, exposing a portion of the substrate. The trench has a linear first portion of a first width and a widened second portion of a second width greater than the first width. A common source region is formed in the exposed portion of the substrate. Portions of the sacrificial layers exposed by the trench are replaced with conductive material to form a gate stack including alternately arranged insulating layers and gate electrode layers. An insulation region is formed that fills the first portion of the trench, partially fills the second portion of the trench and leaves a hole exposing a portion of the common source region. A conductive plug is formed in the hole and connected to the common source region. A strapping line is formed on and in direct electrical contact with the plug. A bit line is formed, electrically connected to at least some of the vertical channel regions.

The methods may further include supplying impurities into an upper portion of the vertical channel to form a drain region before forming of the trench. A common source line may be formed simultaneously with forming the bit line using a common material layer.

An interlayer dielectric may be formed on the substrate, covering the strapping line, and first and second contacts may be formed, passing through the interlayer dielectric and electrically contacting respective one of a vertical channel region and the strapping line.

In further embodiments, methods include forming a mold stack comprising alternately arranged sacrificial layers and insulating layers on a substrate and forming rows of vertical channel regions passing through the mold stack. The methods further include forming respective trenches in the mold stack between adjacent ones of the rows of the vertical channel regions and exposing portions of the substrate, the trenches each having linear first portions of a first width and spaced-apart widened second portions having a second width greater than the first width. Common source regions are formed in the exposed portions of the substrate, and respective gate stacks are formed between respective adjacent pairs of the trenches from the mold stack. Respective insulation regions are formed in respective ones of the trenches, wherein portions of the insulation regions in the widened second portions of the trenches have holes therethrough that expose portions of the common source regions. Conductive plugs are formed in the holes and connected to the common source regions. Respective strapping lines are formed on respective ones of the insulation regions and in direct electrical contact with the plugs. A plurality of bit lines is formed, the bit lines crossing the strapping lines and electrically connected to the vertical channel regions.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 2A through 10A are sectional views illustrating a method of fabricating a three-dimensional semiconductor memory device according to example embodiments of the subject matter and show vertical sections taken along a line A1-A2 of FIG. 1B;

FIGS. 2B through 10B are sectional views illustrating a method of fabricating a three-dimensional semiconductor memory device according to example embodiments of the subject matter and show vertical sections taken along a line B1-B2 of FIG. 1B;

Figure 1A:
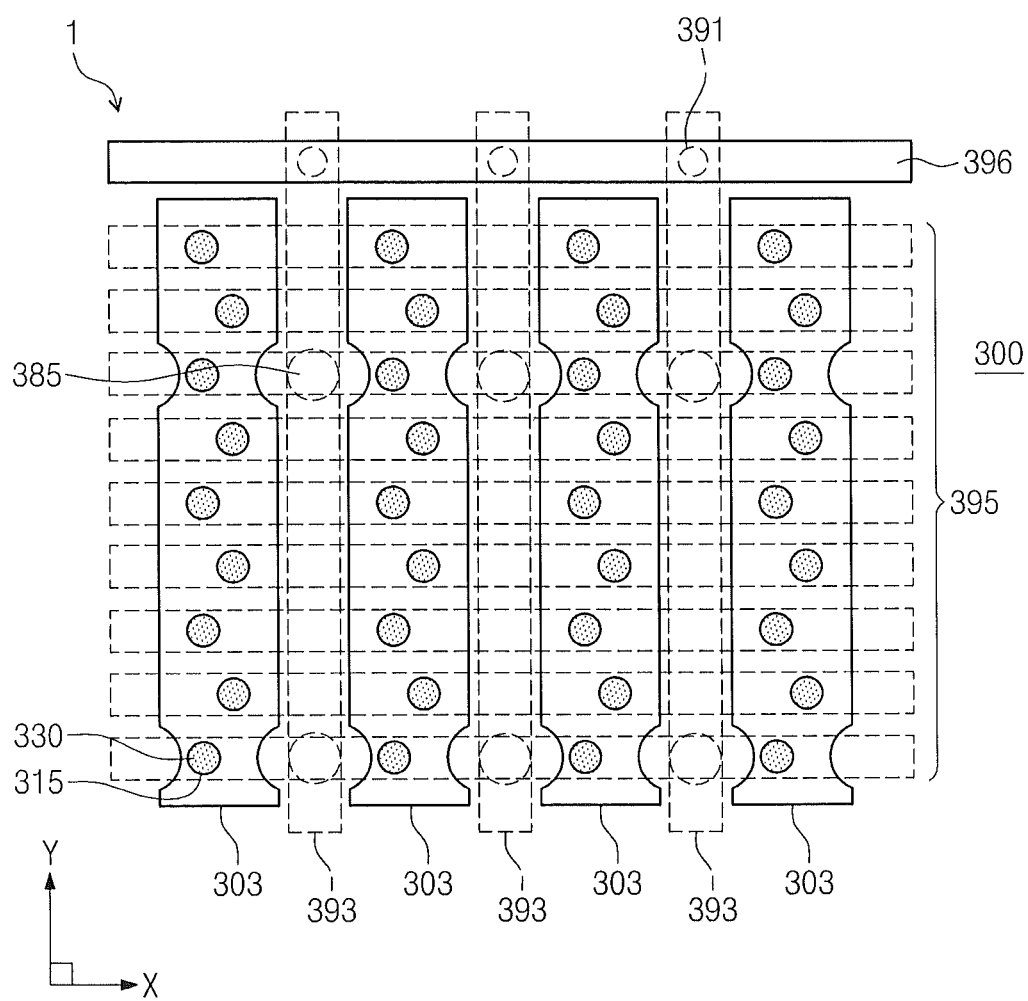
FIGS. 1A and 1B are plan views of a three-dimensional semiconductor memory device according to example embodiments of the subject matter.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the subject matter will now be described more fully with reference to the accompanying drawings, in which example embodiments are shown. Example embodiments of the subject matter may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the subject matter are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the subject matter should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the subject matter belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1B:
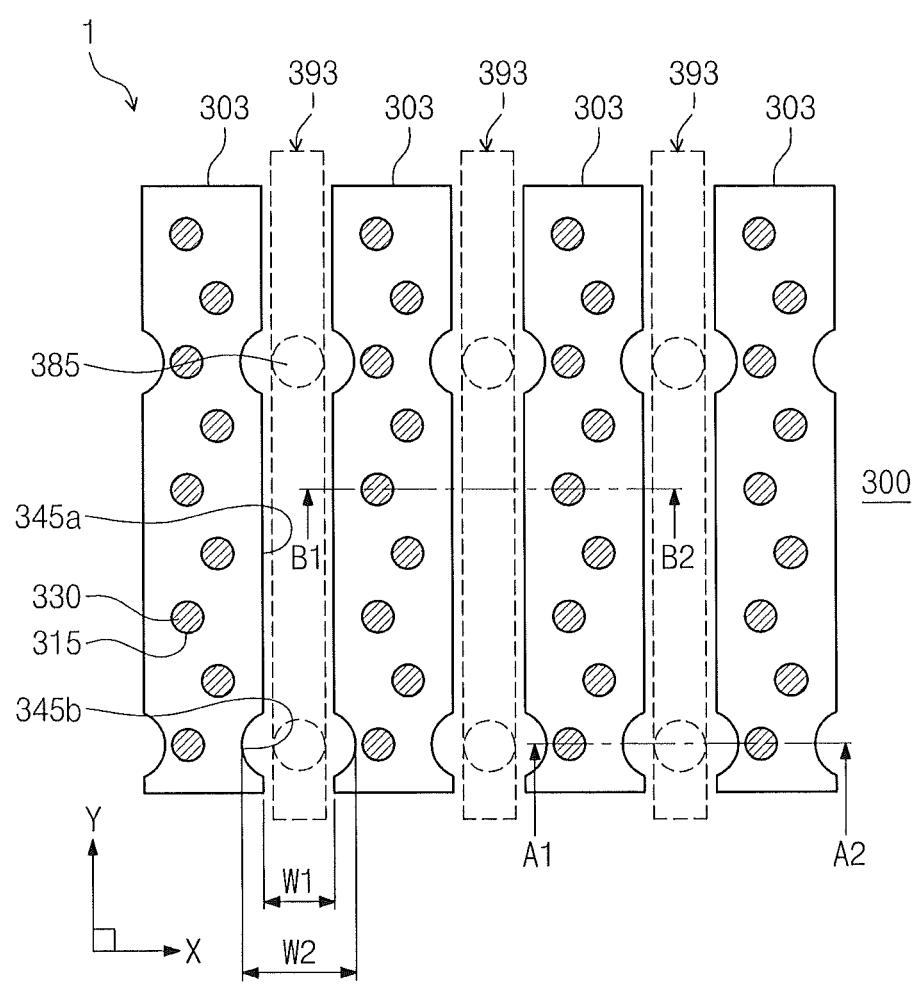
Figure 1C:
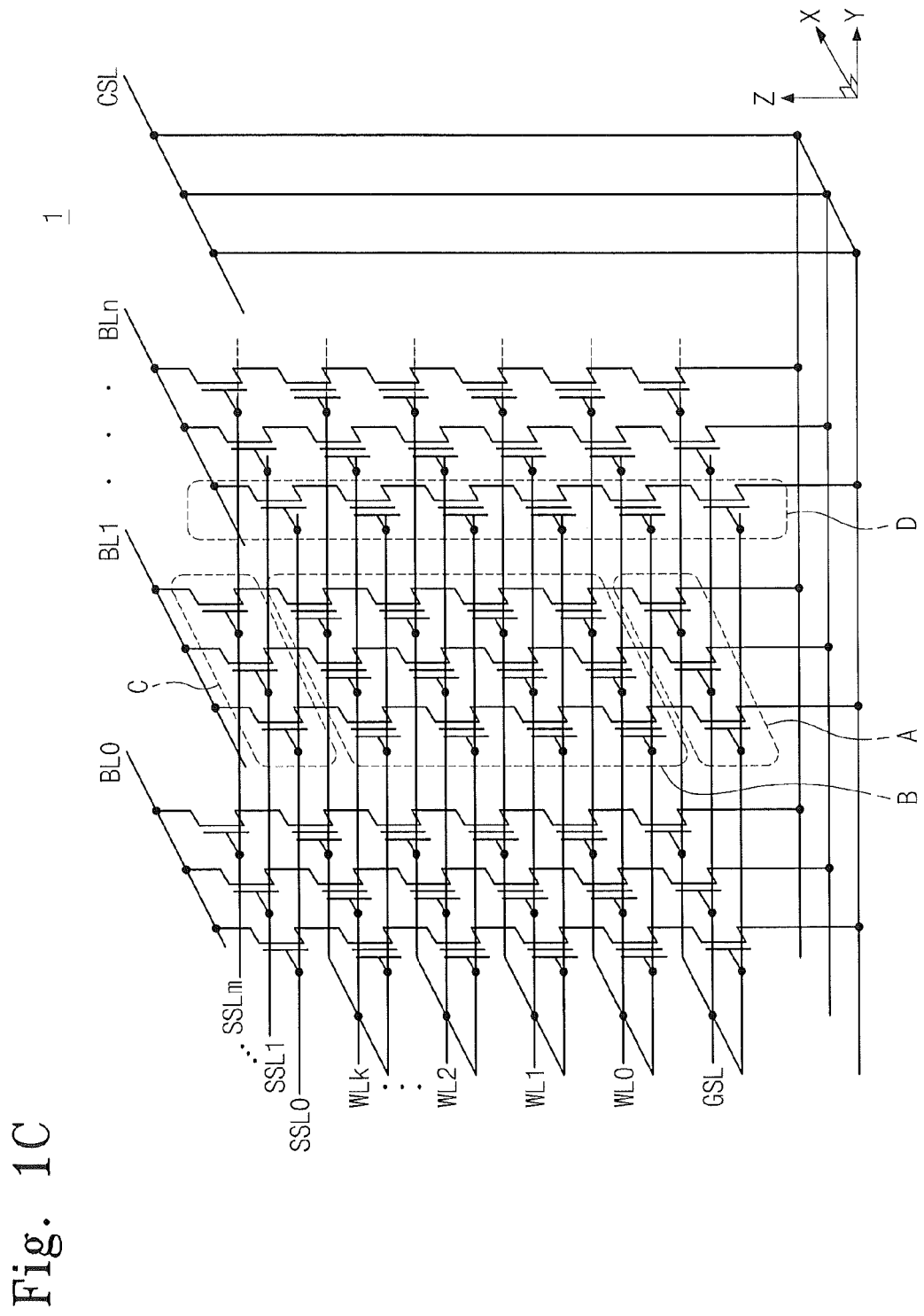
FIG. 1C is an equivalent circuit diagram of a three-dimensional semiconductor memory device according to example embodiments of the subject matter.

FIGS. 1A and 1B are plan views of a three-dimensional semiconductor memory device according to example embodiments of the subject matter. Here, FIG. 1B shows some elements selected from FIG. 1A. FIG. 1C is an equivalent circuit diagram of a three-dimensional semiconductor memory device according to example embodiments of the subject matter.

Referring to FIGS. 1A and 1B, a semiconductor memory device 1 may include gate stacks 303 disposed on a substrate 300, a plurality of bit lines 395 crossing over the gate stacks 303, at least one common source line 396 extending along a direction (e.g., X direction) parallel to the bit lines 395, and a plurality of strapping lines 393 electrically connected to the common source line 396. Each of the gate stacks 303 may include a plurality of gates stacked in a vertical direction, and each common source line 396 may be disposed between every N bit lines 395. Each of the strapping lines 393 may be electrically connected to the common source line 396 via at least one metal contact 391. In some embodiments, the gate stacks 303 and the strapping lines 393 may be substantially orthogonal to the bit lines 395 and the common source line 396. Each of the strapping lines 393 may be disposed between the gate stacks 303 and extend parallel to the gate stacks 303. The strapping lines 393 may be disposed at a level lower than the bit lines 395, and the common source line 396 may be disposed at the same level as the bit lines 395. Each of the gate stacks 303 may have a plurality of vertical holes 315 arranged along a direction (e.g., a Y direction) along which the gate stacks 303 extend. The semiconductor memory device 1 may include a plurality of vertical channel regions 330, respective ones of which fill respective ones of the vertical holes 315. In some embodiments, the vertical holes 315 and vertical channel regions 330 may be arranged in a zigzag configuration.

Figure 10A:
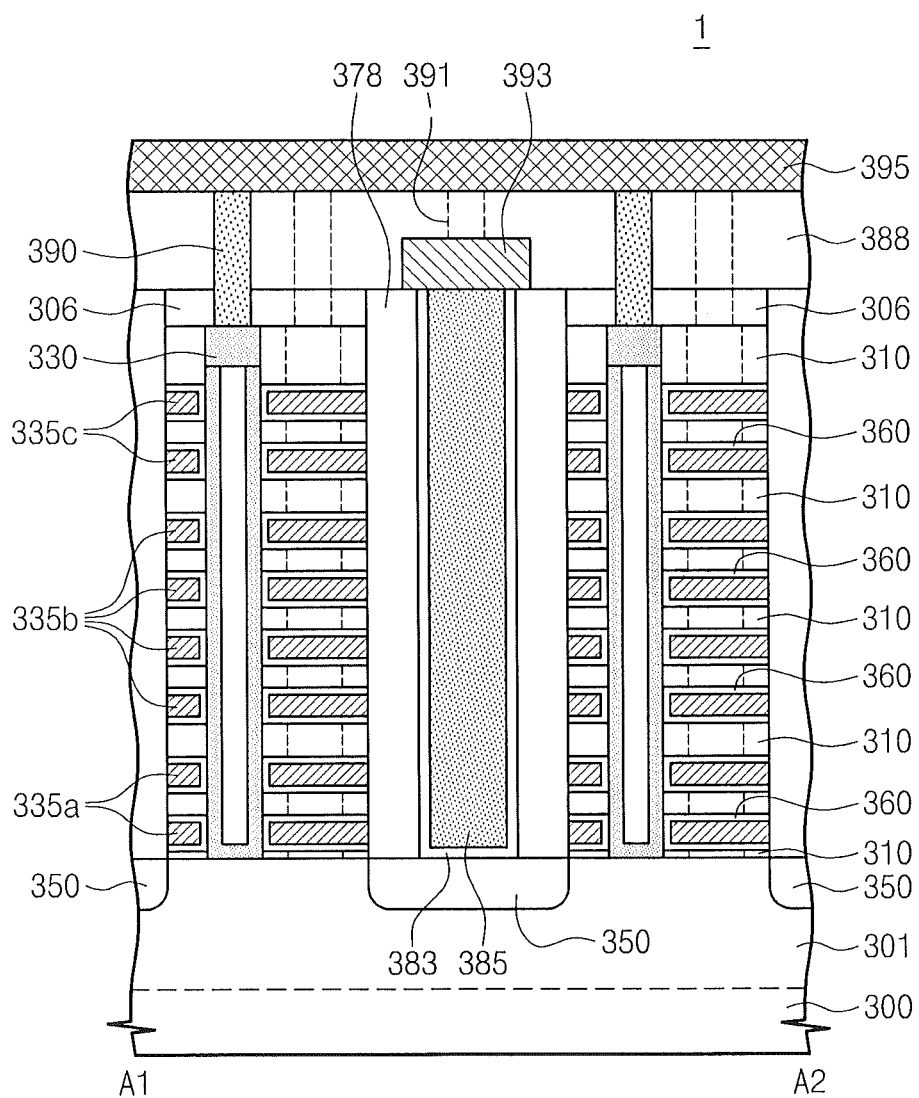
Figure 10B:
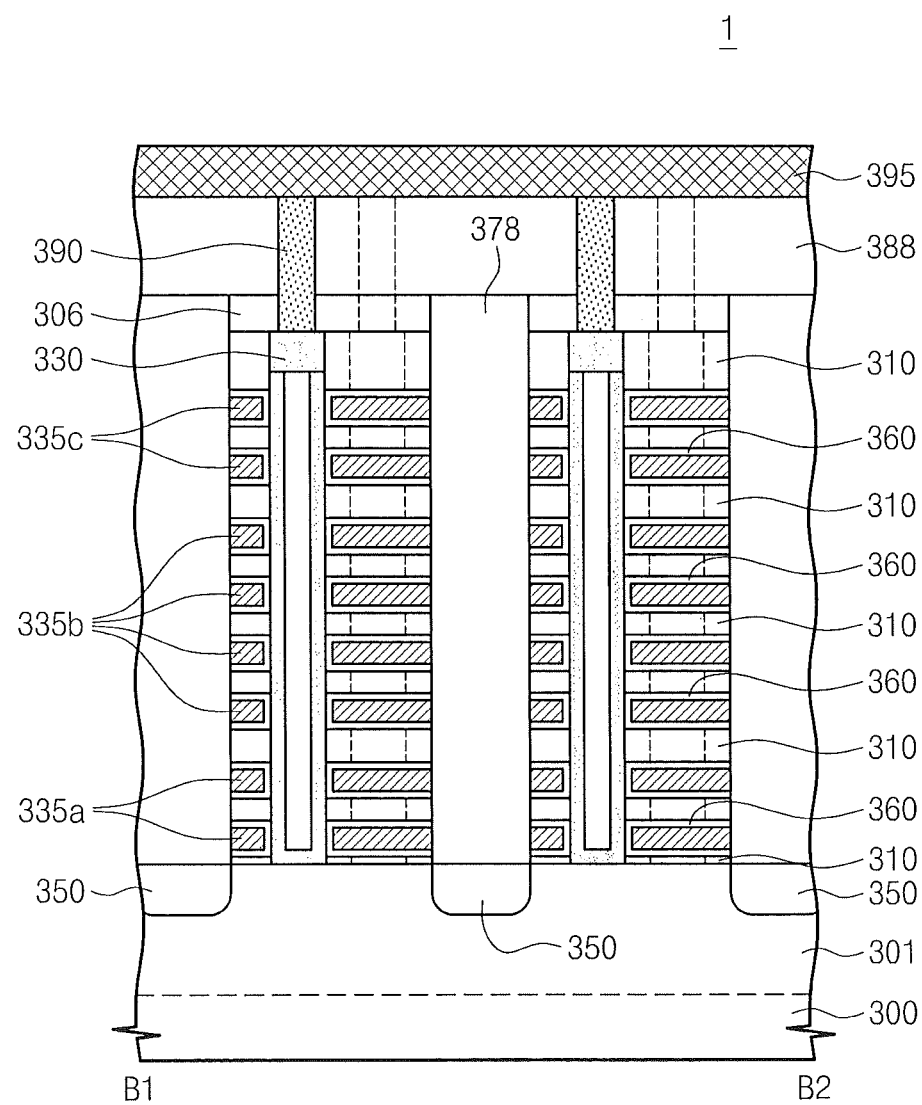

Each of the gate stacks 303 may have sidewalls delimited by trenches having portions 345a and 345b. Each of the trenches include at least one line-shaped first trench portion 345a extending along the Y direction and having a first width W1 and at least one widened second trench portion 345b having a second width W2 greater than the first width W1. Respective plugs 385 connected to the strapping line 393 may be provided in the second trench portions 345b. The second trench portion 345b may have a circular, elliptical or polygonal section in plan view, but example embodiments of the subject matter may not be limited thereto. The first and second trench portions 345a and 345b may be formed to partially expose the substrate 300. As shown in FIGS. 10A and 10B, common source regions 350 may be formed in portions of the substrate 300 exposed by the first and second trench portions 345a and 345b. The common source region 350 may be a doped region and be electrically connected to the strapping line 393 via the plugs 385. A plurality of plugs 385 may be connected to the corresponding one of the strapping lines 393 and be spaced apart from each other in the Y direction. The semiconductor memory device 1 may be configured to have vertical sections shown in FIGS. 10A and 10B.

Referring to FIG. 1C in conjunction with FIG. 1B, the bit lines 395 may correspond to elements depicted by reference numerals BL0, BL1, . . . , BLn of FIG. 1C, the common source line 396 may correspond to an element depicted by a reference numeral CSL of FIG. 1 C. Each of the gate stacks 303 may include a ground selection transistor A controlled by a ground selection line GSL, memory transistors B controlled by word lines WL0, WL1, WL2, . . . , WLk, and at least one string selection transistor C controlled by string selection lines SSL0, SSL1, . . . , SSLm. The ground selection transistor A, the memory transistors B and the string selection transistor C may be vertically stacked along Z direction to share one vertical channel region 330 which forms their channels, thereby forming a cell string D. Each of the bit lines BL0, BL1, . . . , BLn may connect a plurality of cell strings D with each other in a parallel manner. In FIG. 1C, parameters m, n and k are integers.

FIGS. 2A through 10A are sectional views illustrating operations for fabricating three-dimensional semiconductor memory devices according to example embodiments of the subject matter and show vertical sections taken along a line A1-A2 of FIG. 1B. FIGS. 2B through 10B are sectional views illustrating operations for fabricating a three-dimensional semiconductor memory device according to example embodiments of the subject matter and show vertical sections taken along a line B1-B2 of FIG. 1B.

Figure 2A:
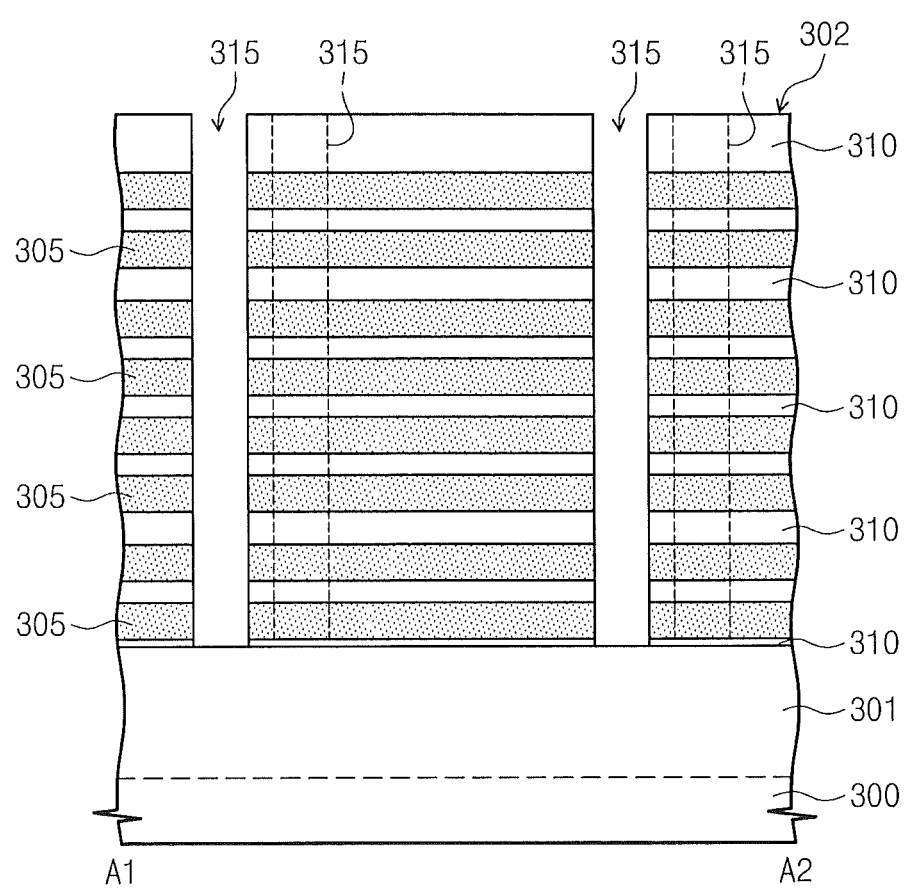
Figure 2B:
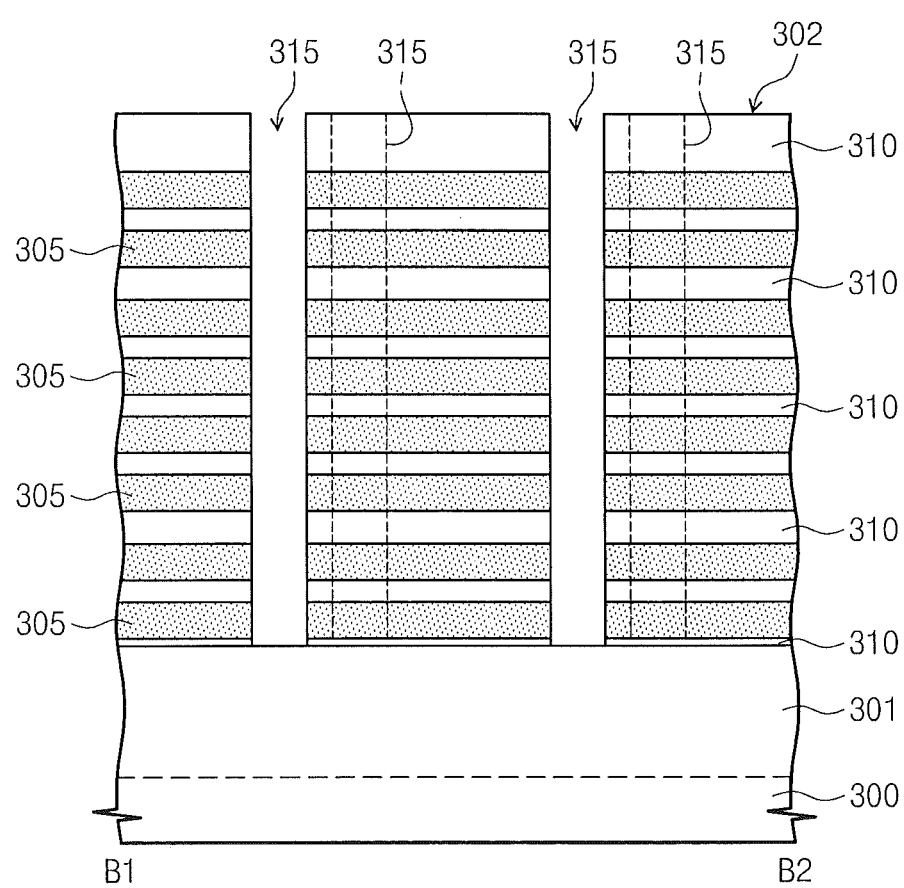

Referring to FIGS. 2A and 2B, a mold stack 302 may be formed on the substrate 300. The substrate 300 may include a semiconductor material, such as silicon. A well region 301 of a first conductivity type (e.g., p type) may be formed in the substrate 300. The mold stack 302 may be formed by alternatingly depositing sacrificial layers 305 and insulating layers 310 on the substrate 300. The sacrificial layers 305 may be formed of a material having an etch selectivity with respect to the insulating layers 310. For example, the insulating layers 310 may be formed of oxide (e.g., SiOx) and the sacrificial layers 305 may be formed of nitride (e.g., SiNx). Subsequently, the mold stack 302 may be patterned to form channel holes 315 exposing the well region 301. The channel holes 315 may be formed to have a zigzag configuration, as shown in FIG. 1B. Dotted lines, in FIGS. 2A and 2B, illustrate some of the channel holes 315 arranged in the zigzag manner.

Figure 3A:
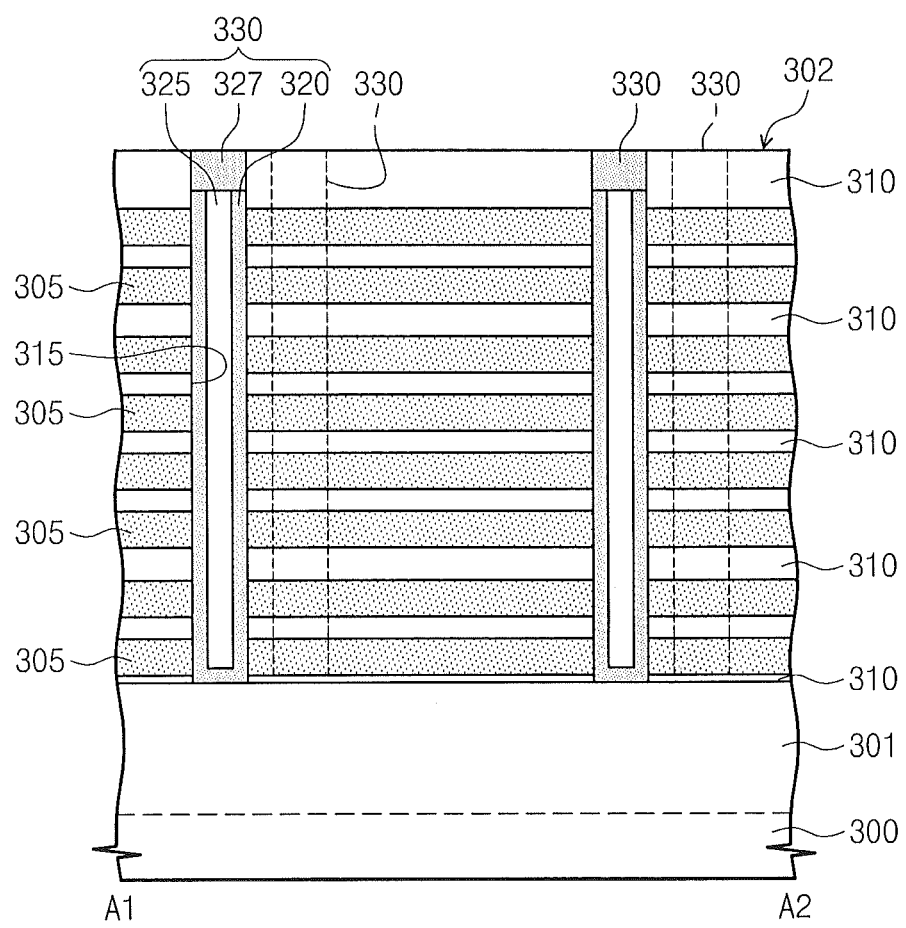
Figure 3B:
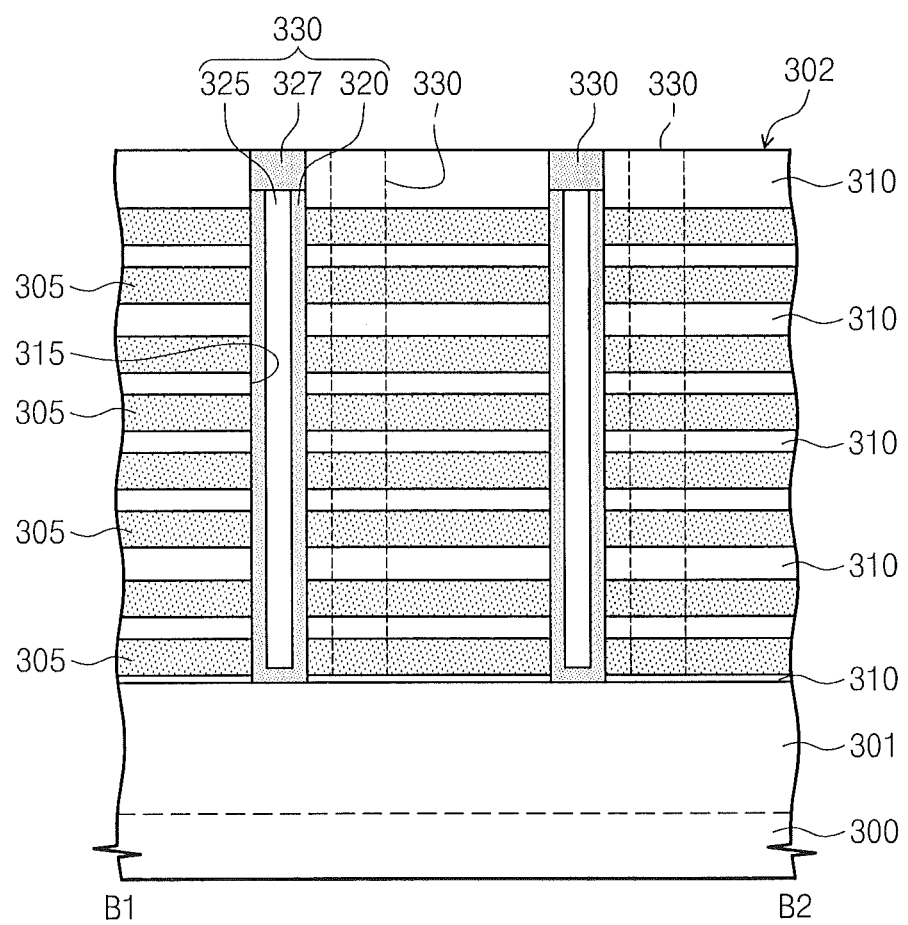

Referring to FIGS. 3A and 3B, vertical channel regions 330 may be formed to fill the channel holes 315, respectively. In some embodiments, each of the vertical channel regions 330 may include a semiconductor layer 320 and an insulating filler 325. The semiconductor layer 320 may be formed to conformally cover side and bottom surfaces of the channel hole 315. For example, the semiconductor layer 320 may have a 'U'-shaped vertical section. The insulating filler 325 may be formed to fill the remaining space of the channel hole 315, which is not occupied by the semiconductor layer 320. The vertical channel region 330 may further include a capping semiconductor layer 327 disposed on the semiconductor layer 320 and the insulating filler 325. A drain region may be formed by providing dopants with a second conductivity type (e.g., n type) into an uppermost portion (e.g., the capping semiconductor layer 327) of the vertical channel region 330. The vertical channel regions 330 may be arranged to have the zigzag configuration, as shown in FIG. 1B. Dotted lines, in FIGS. 3A and 3B, illustrate some of the vertical channel regions 330 arranged in the zigzag manner. The semiconductor layer 320 and the capping semiconductor layer 327 may include a silicon layer.

Figure 4A:
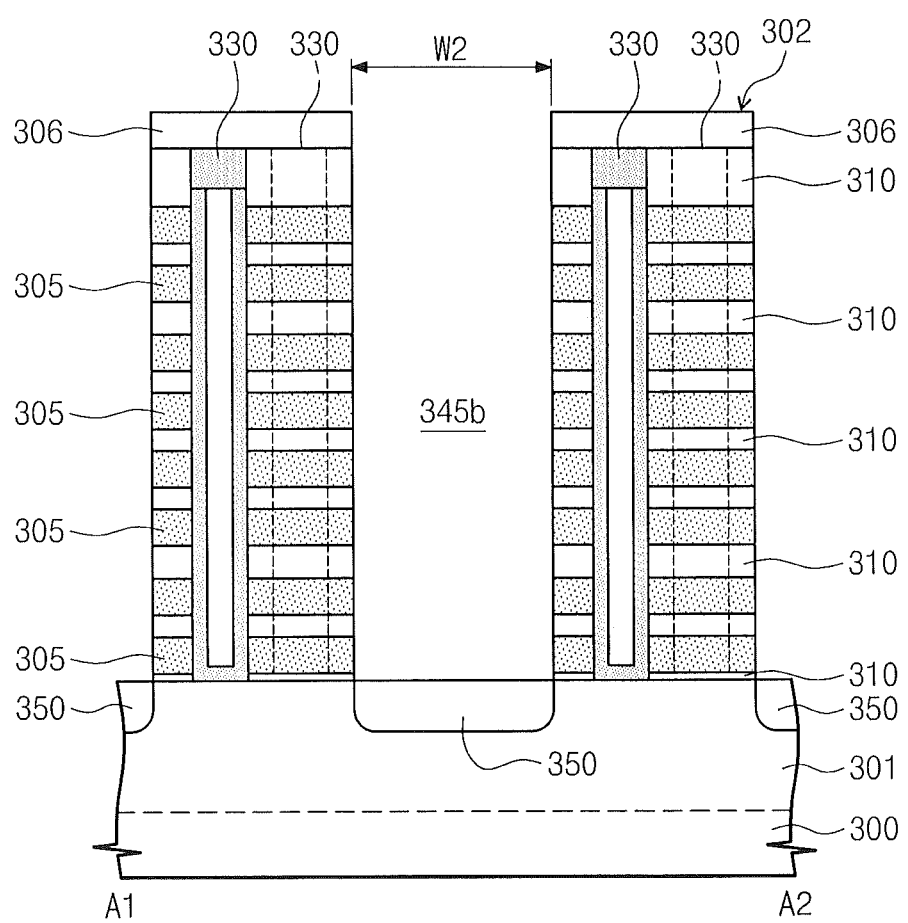
Figure 4B:
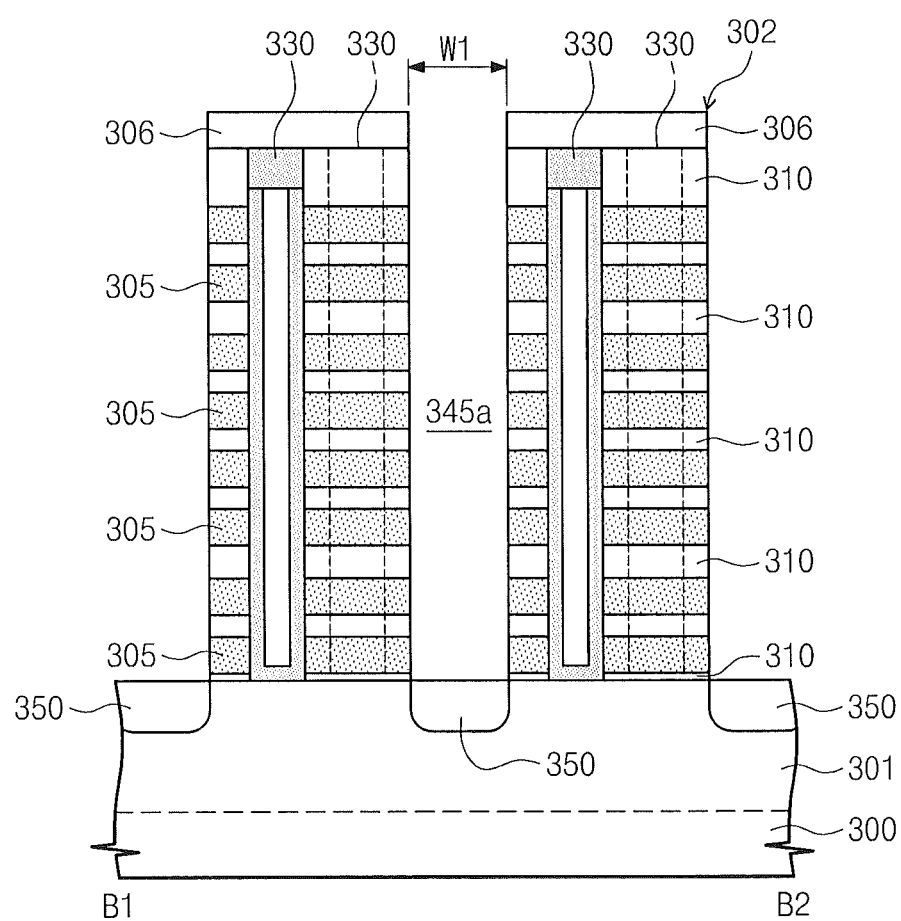

Referring to FIGS. 4A and 4B, the mold stack 302 may be patterned to form the trench portions 345a and 345b. In some embodiments, an insulating capping layer 306 may be formed on the mold stack 302, before the formation of the trench portions 345a and 345b. Each of the trench portions 345a and 345b may be formed to have at least one portion (i.e., the first trench portion 345a) having the first width W1 and at least one widened portion (i.e., the second trench portion 345b) having the second width W2 greater than the first width W1. The second trench portion 345b may be formed to have a circular, elliptical or polygonal section in plan view, but example embodiments of the subject matter may not be limited thereto. In some embodiments, the first and second trench portions 345a and 345b may be formed to have a configuration shown in FIG. 1B. Common source regions 350 may be formed by injecting dopants of second conductivity type (e.g., n-type) into the substrate 300 through the first and second trench portions 345a and 345b. As a result, the common source regions 350 may have a line shape elongated along the first trench portion 345a.

Figure 5A:
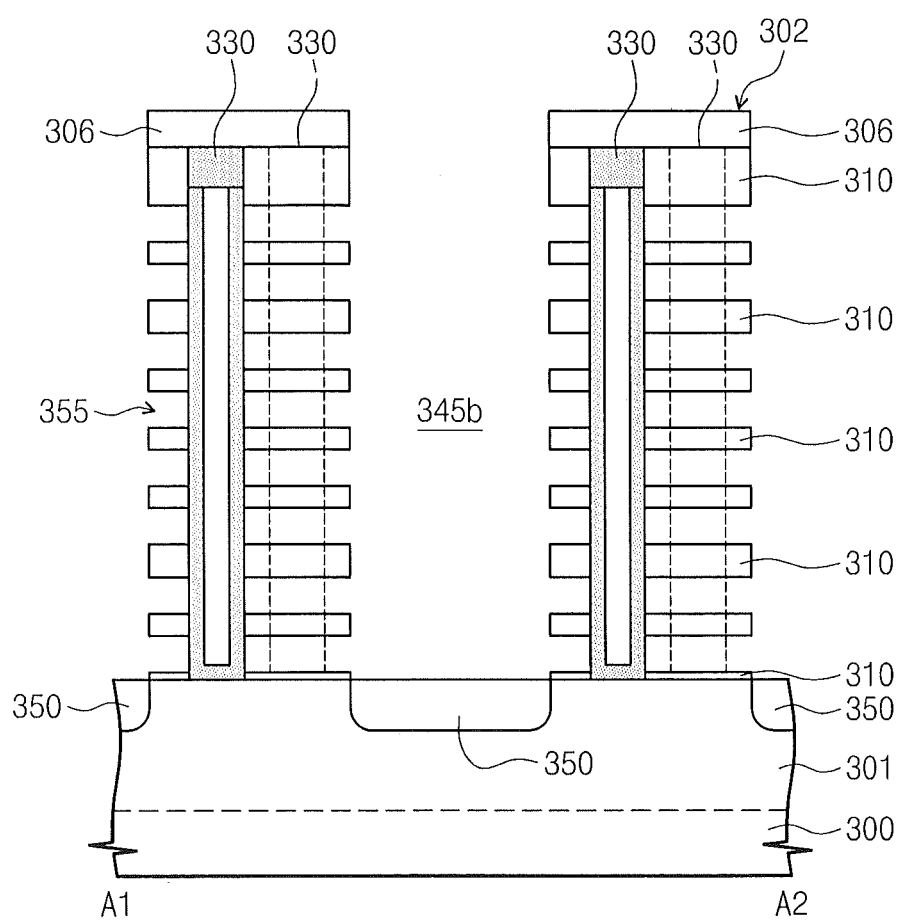
Figure 5B:
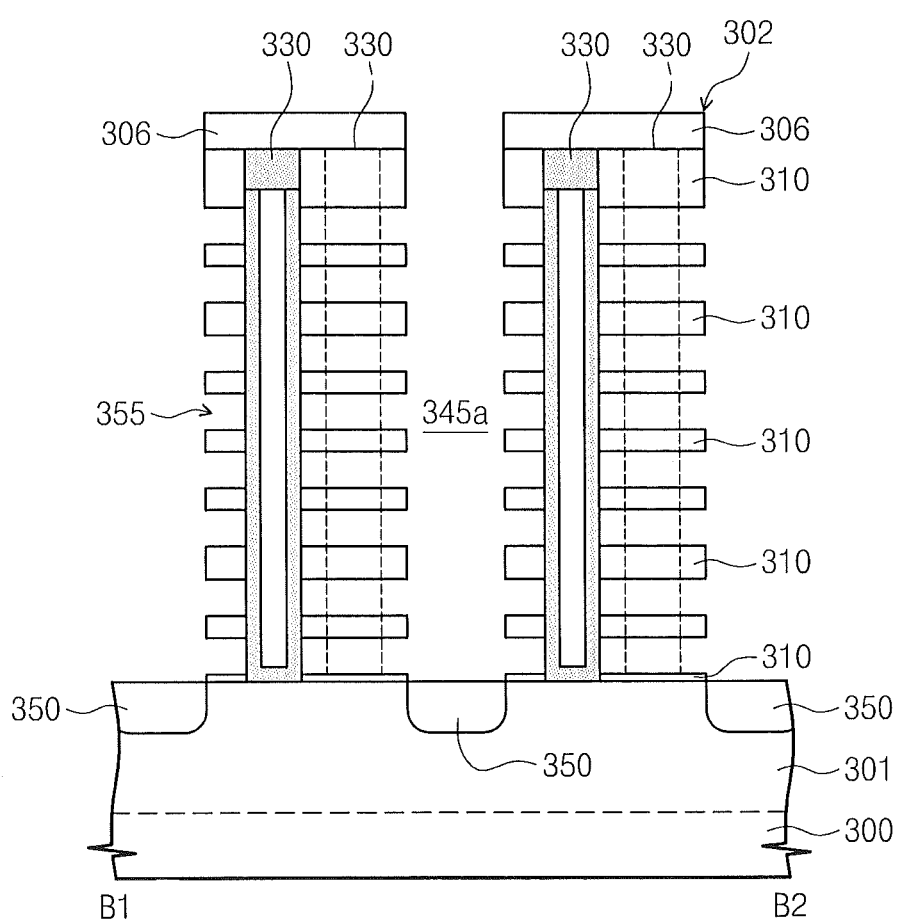

Referring to FIGS. 5A and 5B, the sacrificial layers 305 may be selectively removed to form recesses 355 between the insulating layers 310. For example, the formation of the recesses 355 may include etching the sacrificial layers 305 exposed by the trench portions 345a and 345b in a wet etching manner and be performed using an etchant capable of selectively etching the sacrificial layers 305. For example, in the case in which the sacrificial layers 305 are formed of silicon nitride, the removal of the sacrificial layers 305 may include supplying an etching solution containing phosphoric acid through the first and second trench portions 345a and 345b.

Figure 6A:
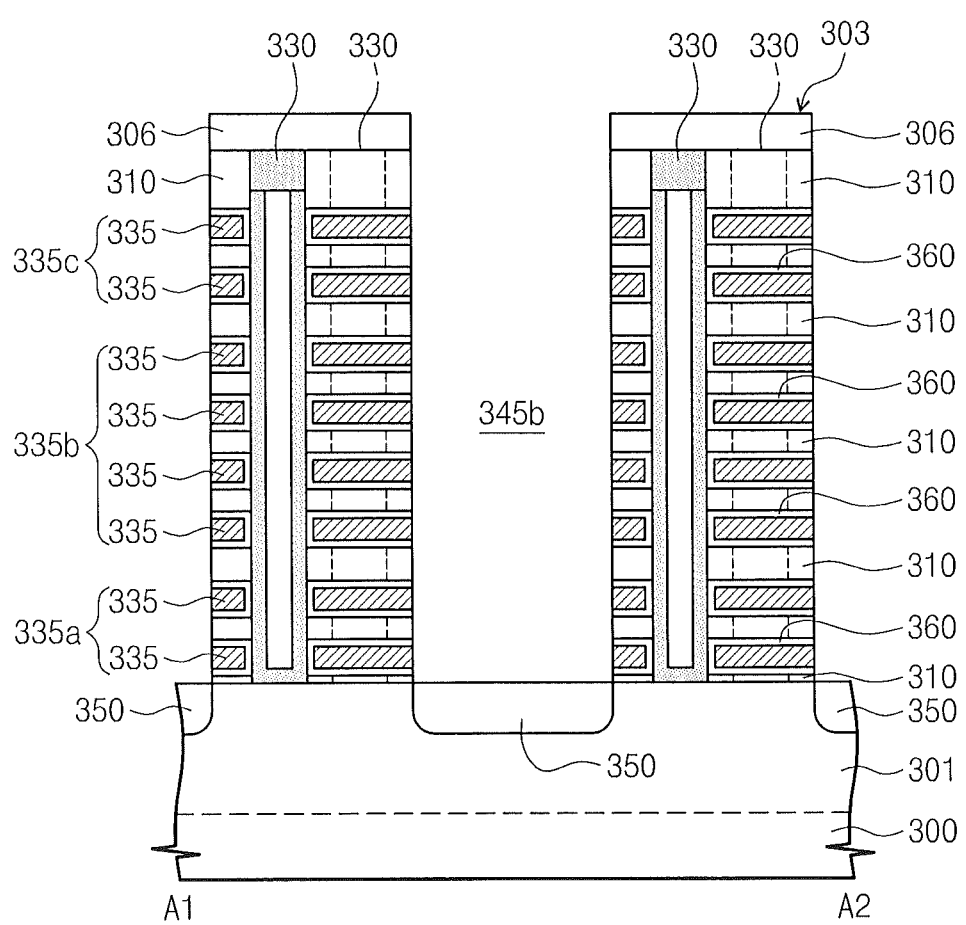
Figure 6B:
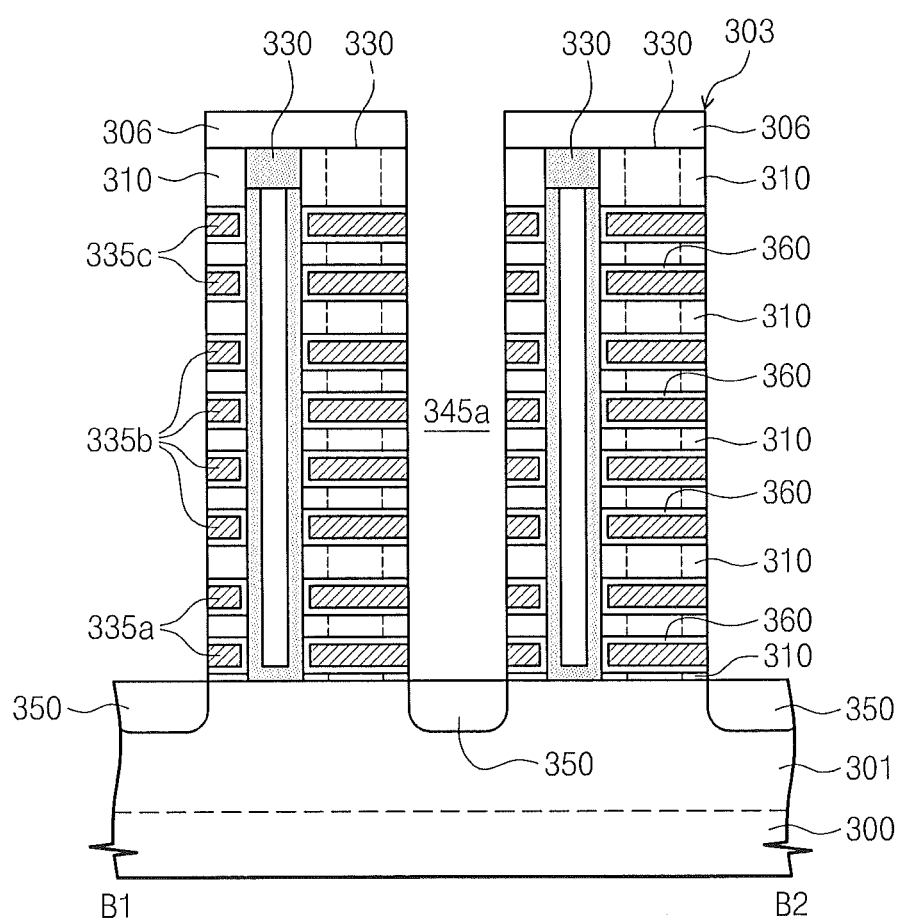

Referring to FIGS. 6A and 6B, memory layers 360 may be conformally formed over inner walls of the recesses 355, and gates 335 may be formed to fill recess the remaining spaces of the regions 355. As a result, the gates 335 may be vertically stacked on the substrate 300 and constitute the gate stacks 303. In other words, each of the gate stacks 303 may include a plurality of vertically stacked gates 335, which may be used as at least one ground selection gate 335a, at least one string selection gate 335c, and a plurality of cell gates 335b therebetween. In some embodiments, either or both of the ground and string selection gates 335a and 335c may be realized using a plurality of layers (e.g., two vertically-stacked gates 335). The gate 335 may include, for example, a doped semiconductor (e.g., dopes silicon), a metal (e.g., tungsten, copper, and aluminum), a conductive metal nitride (e.g., titanium nitride and tantalum nitride), and/or a transition metal (e.g., titanium and tantalum). The memory layer 360 may include a tunnel layer (e.g., of silicon oxide) adjacent to the vertical channel region 330, a blocking layer (e.g., of silicon oxide, aluminum oxide, or hafnium oxide) adjacent to the gate 335, and a trap insulating layer (e.g., of silicon nitride) interposed between the tunnel layer and the blocking layer.

Figure 7A:
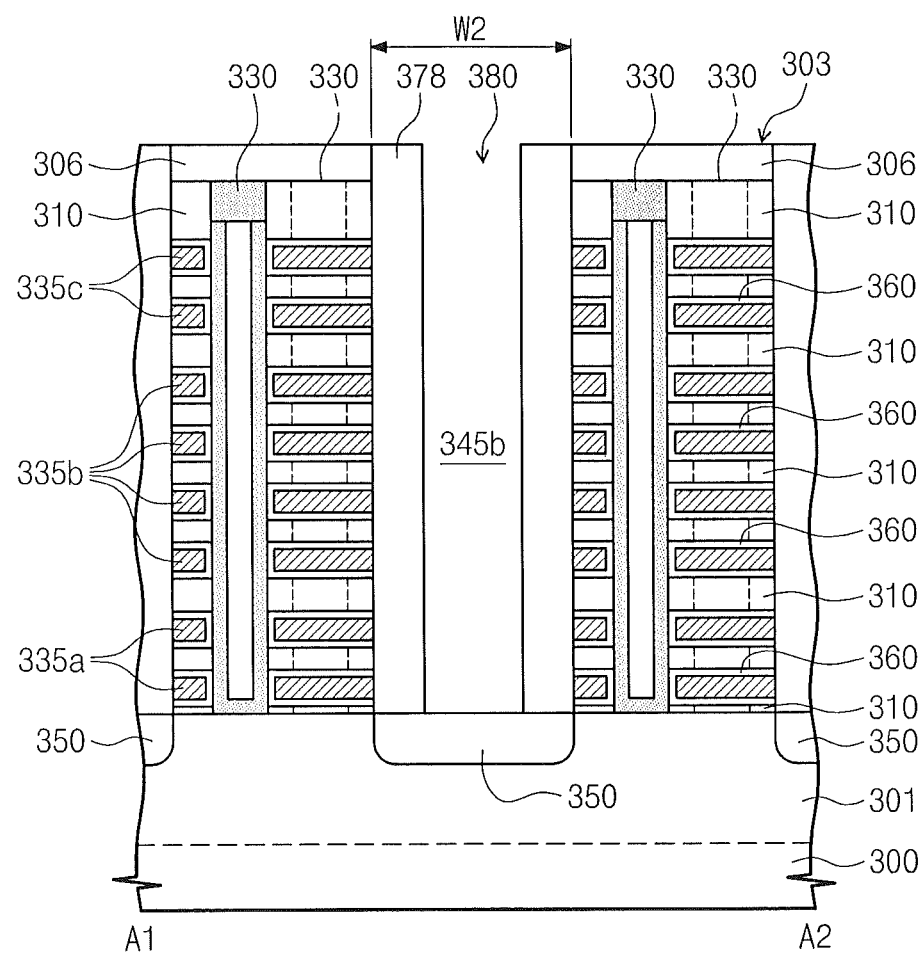
Figure 7B:
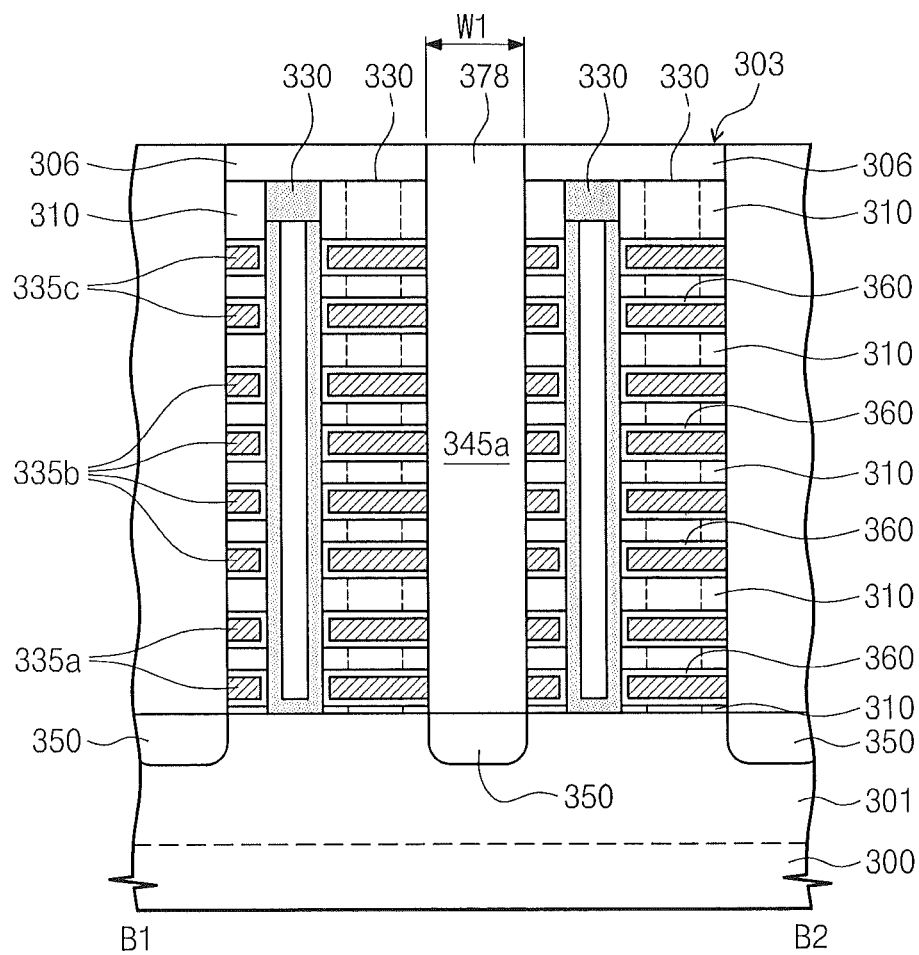

Referring to FIGS. 7A and 7B, insulating trench fillers 378 may be formed in the trench portions 345a and 345b. The formation of the insulating trench fillers 378 may include depositing an insulating layer on the structure provided with the gate stacks 303 and then anisotropically etching the insulating layer. The insulating layer for the insulating trench fillers 378 may be conformally deposited to fully fill the first trench portion 345a but partially fill the second trench portion 345b. As a result, the resulting insulating trench filler 378 may be formed to fill fully the first trench portion 345a as shown in FIG. 7B but to partially fill the second trench portion 345b as shown in FIG. 7A. In other words, the insulating trench filler 378 may be formed to define a hole 380 in the second trench portion 345b. In some embodiments, the hole 380 may be formed to expose the common source region 350 and be self-aligned to the common source region 350 or the second trench portion 345b.

Figure 8A:
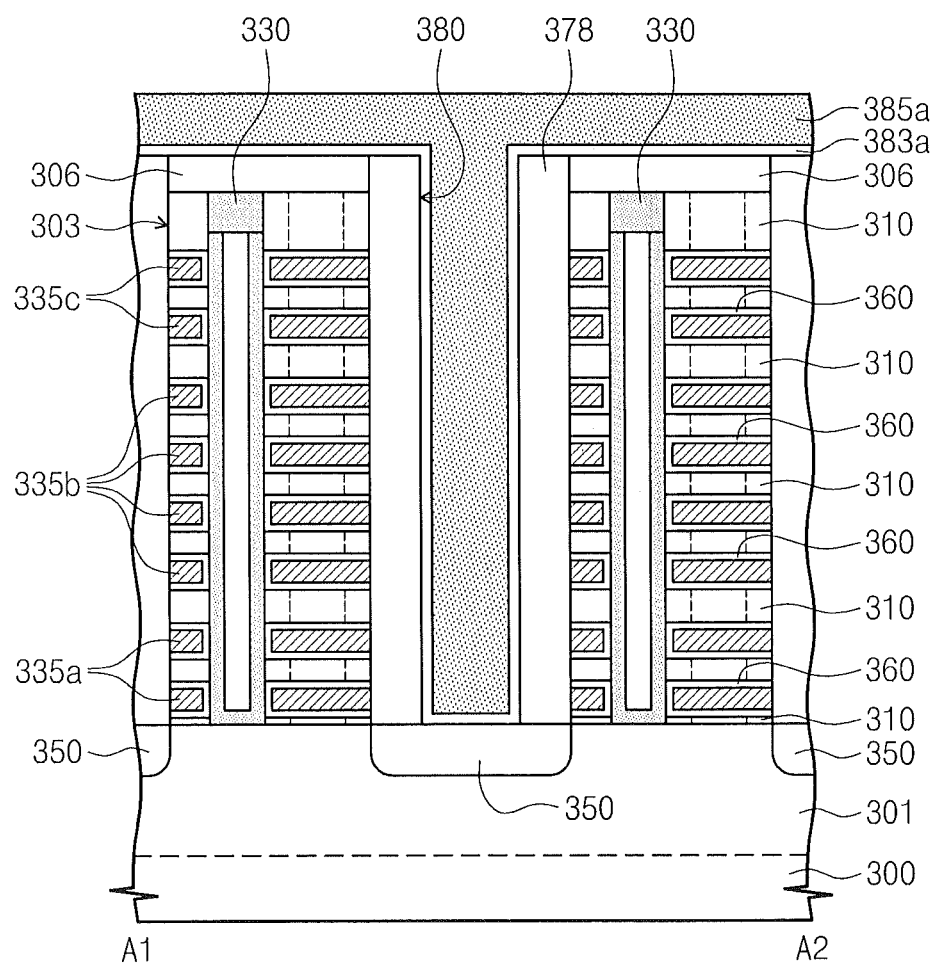
Figure 8B:
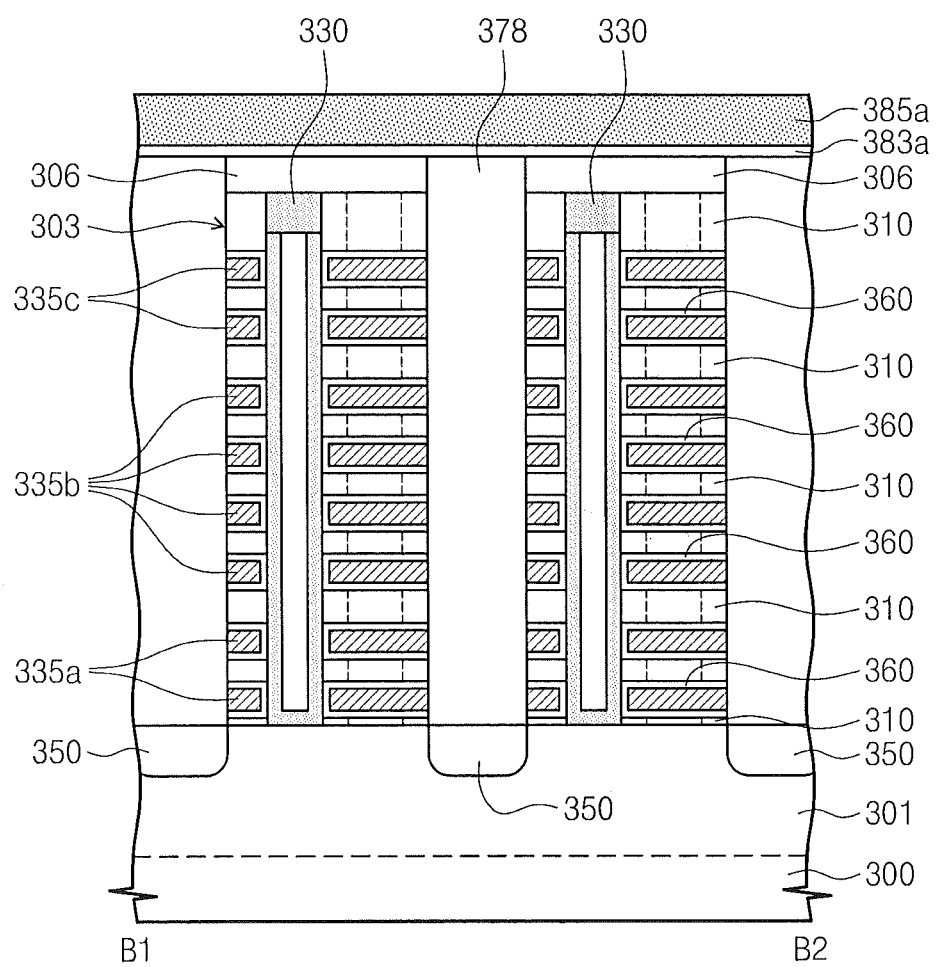

Referring to FIGS. 8A and 8B, a conductive layer 385a may be formed in the hole 380. In some embodiments, before the formation of the conductive layer 385a, a barrier layer 383a may be formed over the common source region 350 exposed by the hole 380. For example, the barrier layer 383a may be formed by conformally depositing a conductive layer (e.g., of metal nitride such as titanium nitride or tantalum nitride) and thus conformally cover side and bottom surfaces of the hole 380 and a top surface of the gate stack 303. The conductive layer 385a may be formed of a metal layer (e.g., of tungsten, copper or aluminum) or a transition metal layer (e.g., of titanium or tantalum).

Figure 9A:
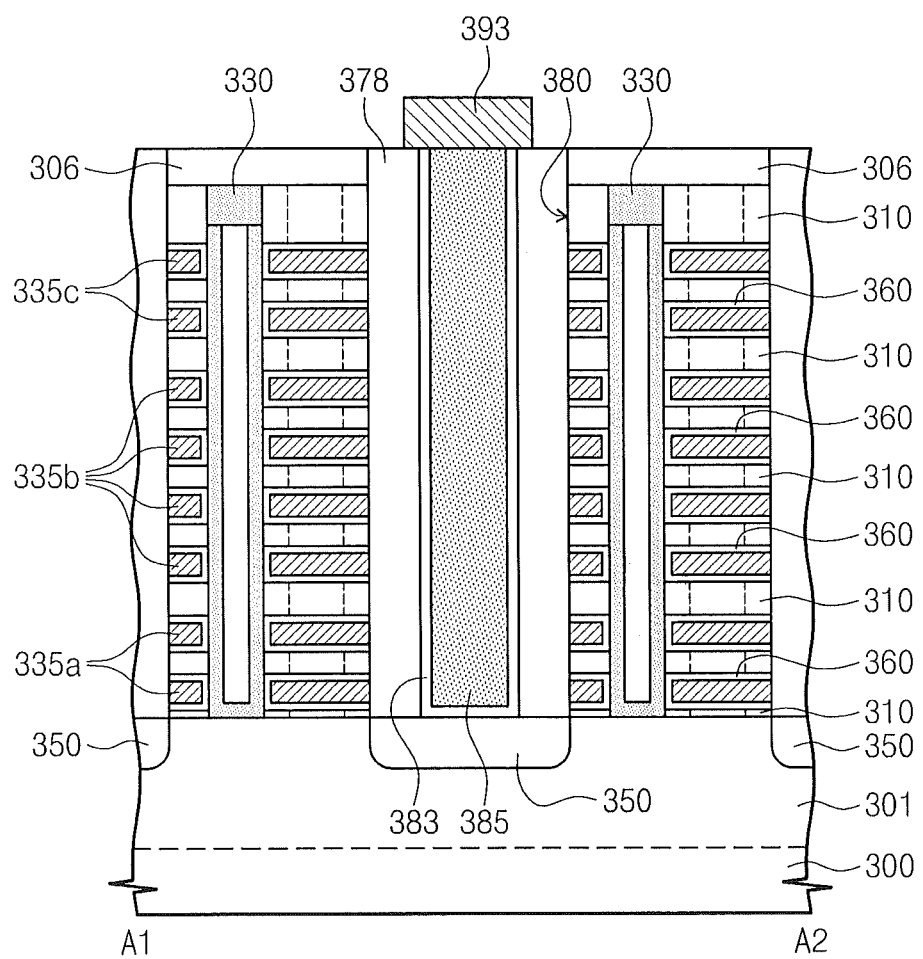
Figure 9B:
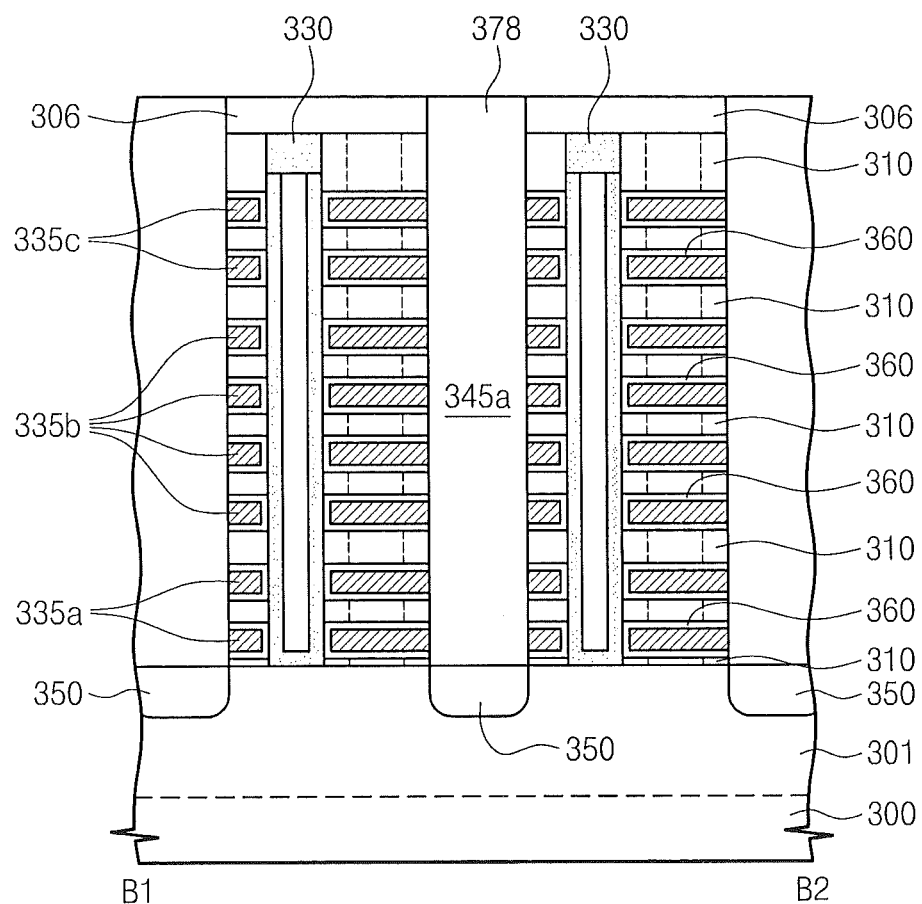

Referring to FIGS. 9A and 9B, the conductive layer 385a and the barrier layer 383a may be planarized using, for example, an etch-back or chemical-mechanical polishing technique to expose the insulating capping layer 306. As a result, a barrier 383 with a 'U'-shaped section may be formed to conformally cover the side and bottom surfaces of the hole 380, and a plug 385 may be formed to fill the remaining space of the hole 380. The plug 385 may be electrically connected to the common source region 350 in a self-aligned manner. In some embodiments, a top surface of the plug 385 may be located at level higher than that of the vertical channel region 330.

The strapping line 393 may be formed by depositing and patterning a conductive material. The strapping line 393 may be electrically connected to the plug 385. The strapping line 393 may be formed, for example, from a metal (e.g., tungsten, copper, and aluminum), a conductive metal nitride (e.g., titanium nitride and tantalum nitride) and/or a transition metal (e.g., titanium and tantalum). The strapping line 393 may be patterned to have a line shape extending along the common source region 350. The strapping line 393 may be located at a level higher than the top surface of the vertical channel region 330.

According to some example embodiments of the subject matter, the strapping line 393 may be connected to the plug 385 without an additional metal contact plug interposed therebetween. This may allow omission of several process steps of, for example, depositing and etching an additional insulating layer and an additional metal layer, and performing an additional chemical-mechanical polishing process. Furthermore, it is possible to reduce or prevent technical problems accompanied by the formation of the additional metal contact plug from occurring. For example, it is possible to reduce the likelihood of formation of a void in the insulating trench filler 378 and to thus reduce the likelihood of an electric short circuit between the string selection gate 335c and the barrier 383 or between the string selection gate 335c and the plug 385.

Referring to FIGS. 10A and 10B, an interlayer dielectric 388 may be formed on the substrate 300, and respective metal contacts 390 may be formed through the interlayer dielectric 388 and the capping layer 306, connecting to respective ones of the vertical channel regions 330. Bit lines 395 may be formed on the interlayer dielectric 395, electrically connected to the vertical channel regions 330 via the metal contacts 390. The bit lines 395 may be formed, for example, from a metal (e.g., tungsten, copper, and aluminum), a conductive metal nitride (e.g., titanium nitride and tantalum nitride) and/or a transition metal (e.g., titanium and tantalum). Bit lines 395 may be formed at a level higher than a top surface of the plug 385 and the strapping line 393 and extend along a direction crossing the strapping line 393. In addition, second metal contacts 391 may be formed through the interlayer dielectric 388, and a common source line 396 shown in FIG. 1A may be formed, connected to the second metal contact 391. The second metal contact 391 may be coupled to the strapping line 393 and may electrically connect the strapping line 393 to the common source line 396. The second metal contact 391 and the metal contact 390 may be simultaneously formed using the same process, and the common source line 396 and the bit lines 395 may be simultaneously formed using the same process.

Figure 11A:
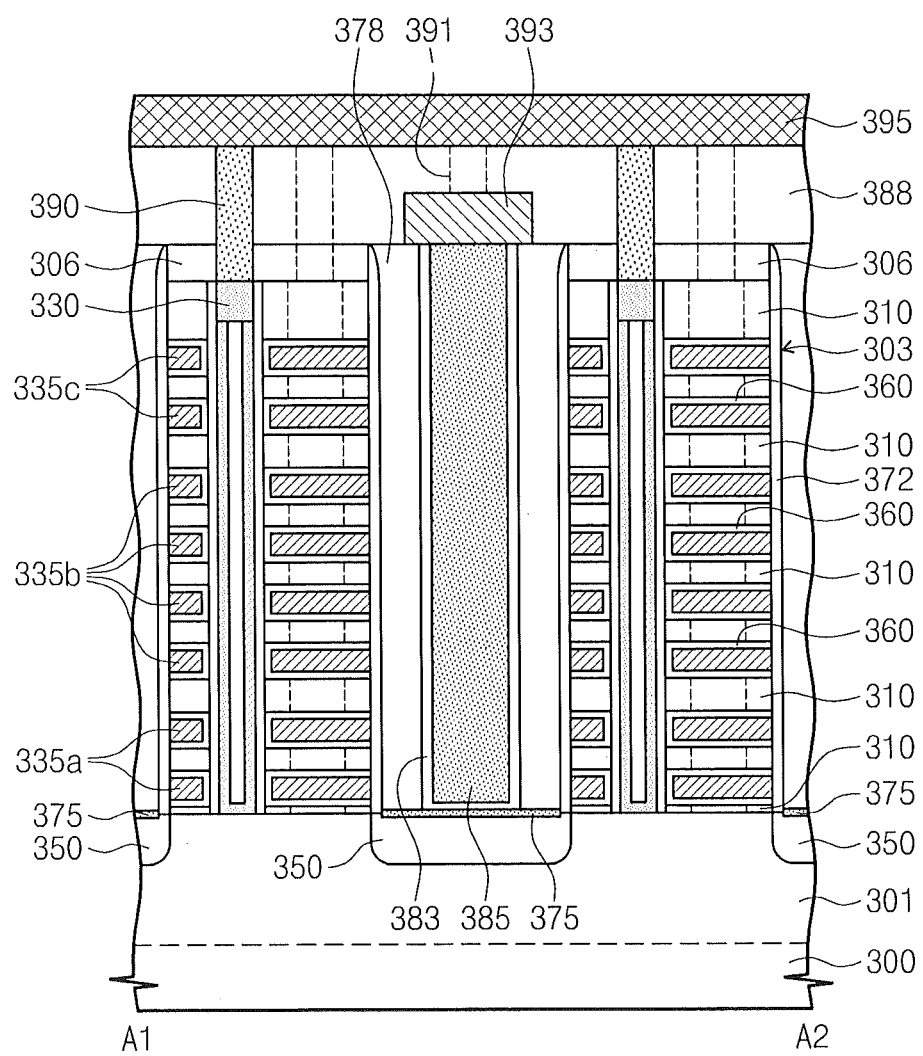
FIGS. 11A and 11B are sectional views illustrating a method of fabricating a three-dimensional semiconductor memory device according to other example embodiments of the subject matter and shows vertical sections taken along lines A1-A2 and B1-B2, respectively, of FIG. 1B.
Figure 11B:
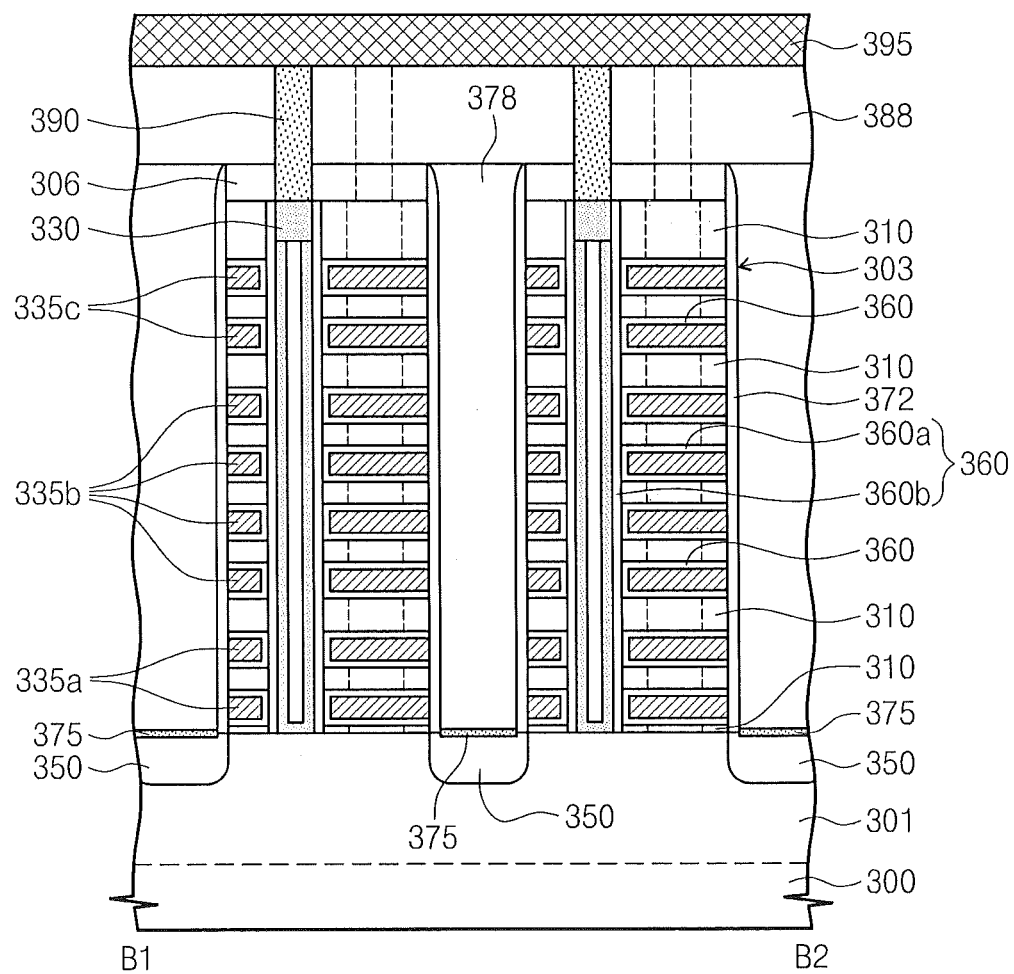
Figure 12A:
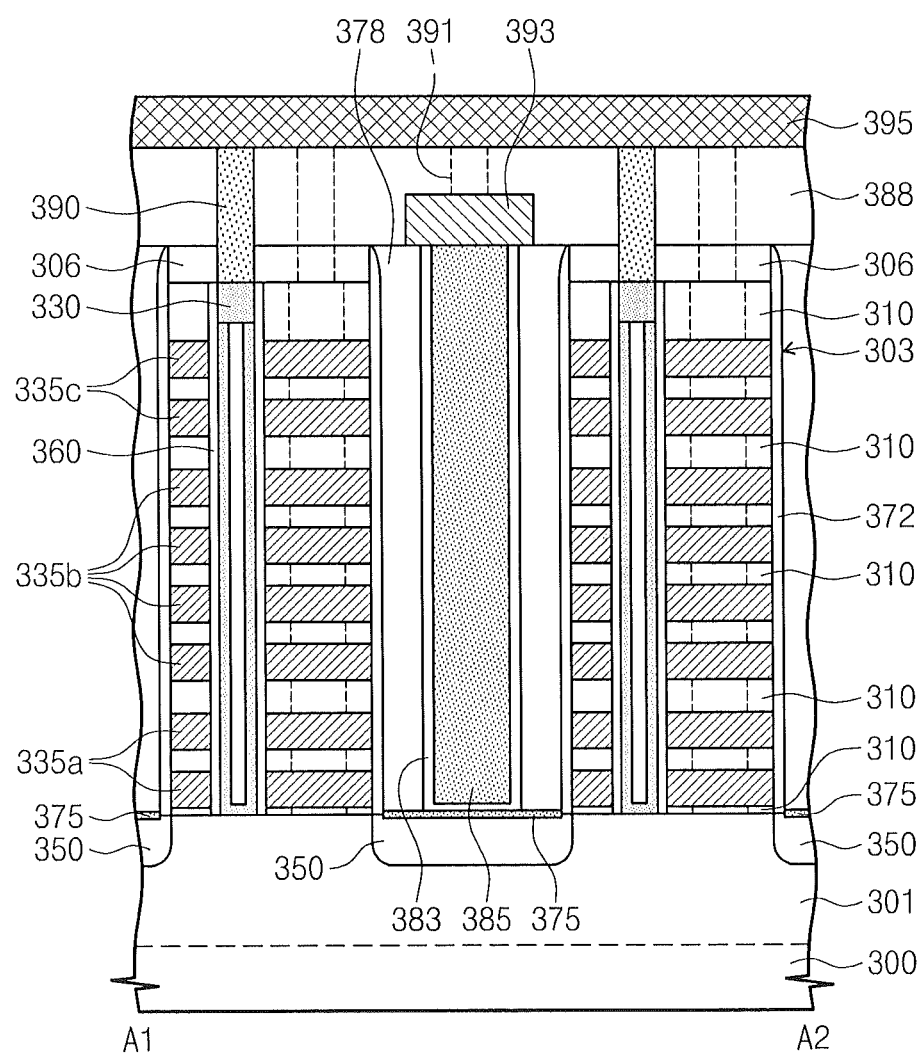
FIGS. 12A and 12B are sectional views illustrating a method of fabricating a three-dimensional semiconductor memory device according to still other example embodiments of the subject matter and shows vertical sections taken along lines A1-A2 and B1-B2, respectively, of FIG. 1B.
Figure 12B:
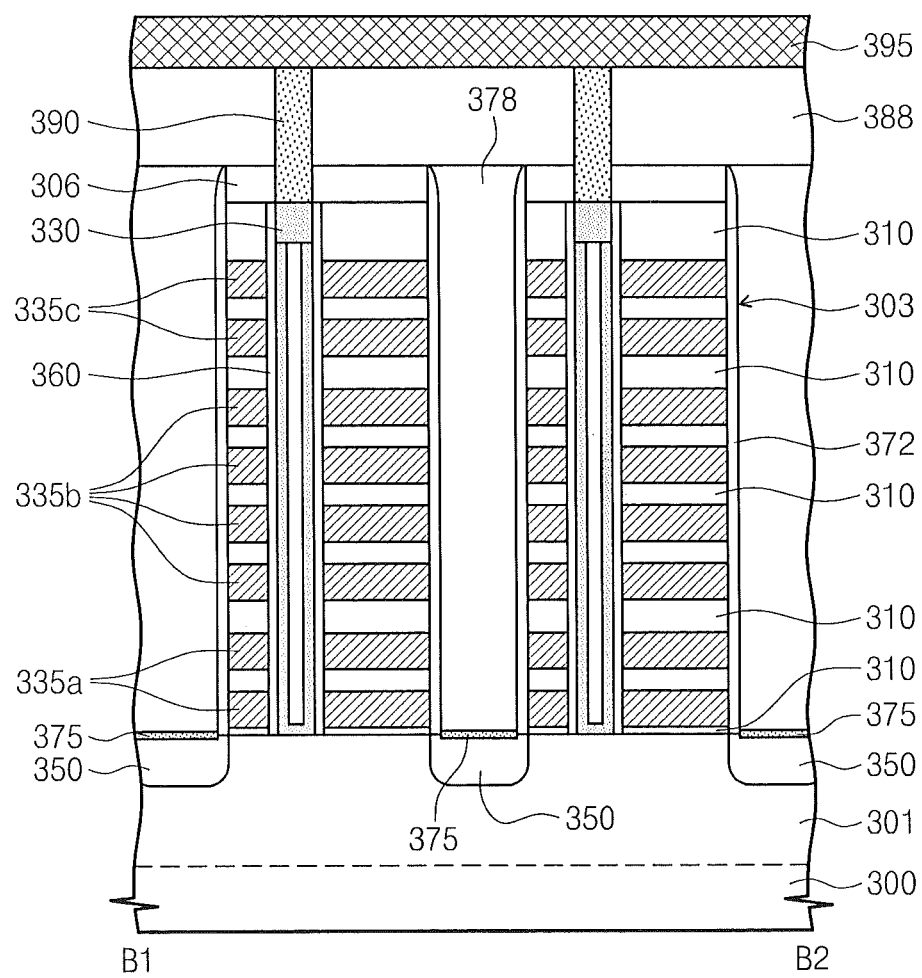

FIGS. 11A and 11B are sectional views illustrating operations for fabricating a three-dimensional semiconductor memory device according to further example embodiments of the subject matter, and FIGS. 12A and 12B are sectional views illustrating operations for fabricating a three-dimensional semiconductor memory device according to still other example embodiments of the subject matter. FIGS. 11A and 12A shows vertical sections taken along a line A1-A2 of FIG. 1B, and FIGS. 11B and 12B shows vertical sections taken along a line B1-B2 of FIG. 1B.

Referring to FIGS. 11A and 11B, a spacer layer 372 may be formed on sidewalls of the gate stack 303. A metal-semiconductor compound layer 375 (such as CoSix) may be formed on a top surface of the common source region 350. The metal-semiconductor compound layer 375 may be formed in a region delimited by the spacer layer 372. The formation of the memory layer 360 may include forming a first layer 360a surrounding the gates 335a, 335b and 335c and a second layer 360b vertically extending along a sidewall of the vertical channel region 330. The first layer 360a may include the tunnel layer, and the second layer 360b may include the blocking layer. One of the first and second layers 360a and 360b may further include a trap insulating layer.

Referring to FIGS. 12A and 12B, according to the present embodiments, the memory layer 360 may be formed to vertically extend along a sidewall of the vertical channel region 330. For example, the gates 335a, 335b and 335c may be formed in direct contact with a top or bottom surface of the insulating layers 310. This may allow an increase in vertical thicknesses of the gates 335a, 335b and 335c or a reduction of a vertical thickness of the gate stack 303.

Figure 13A:
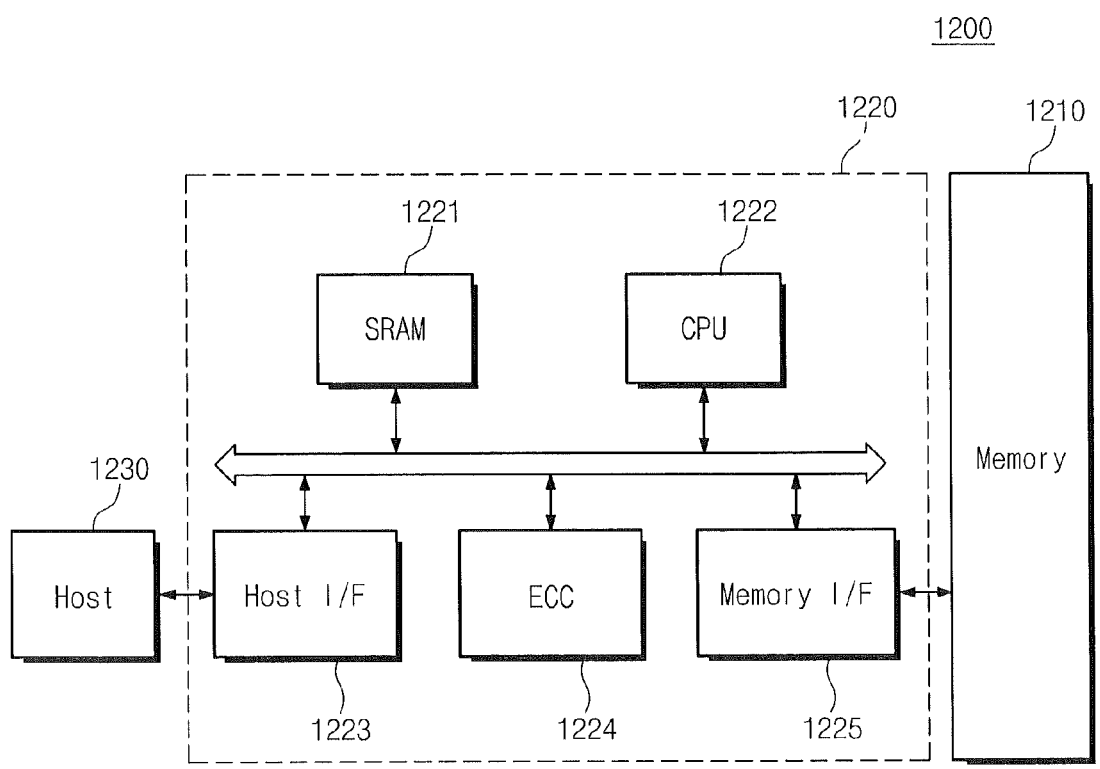
FIG. 13A is a block diagram of a memory card including a three-dimensional semiconductor memory device according to example embodiments of the subject matter.

FIG. 13A is a block diagram of a memory card including a three-dimensional semiconductor memory device according to example embodiments of the subject matter. Referring to FIG. 13A, a memory card 1200 may include a memory controller 1220 controlling general data exchanges between a host and the memory device 1210. A static random access memory (SRAM) 1221 may be used as an operating memory of a processing unit 1222. A host interface 1223 may include a data exchange protocol of a host connected to a memory card 1200. An error correction block 1224 may detect and correct errors included in data read from a multi-bit memory device 1210. A memory interface 1225 may interface with the memory device 1210. A processing unit 1222 may perform general control operations for data exchange of the memory controller 1220. The memory card 1200 may be realized using a memory device 1210 including the three-dimensional semiconductor memory devices 1 according to example embodiments of the subject matter.

Figure 13B:
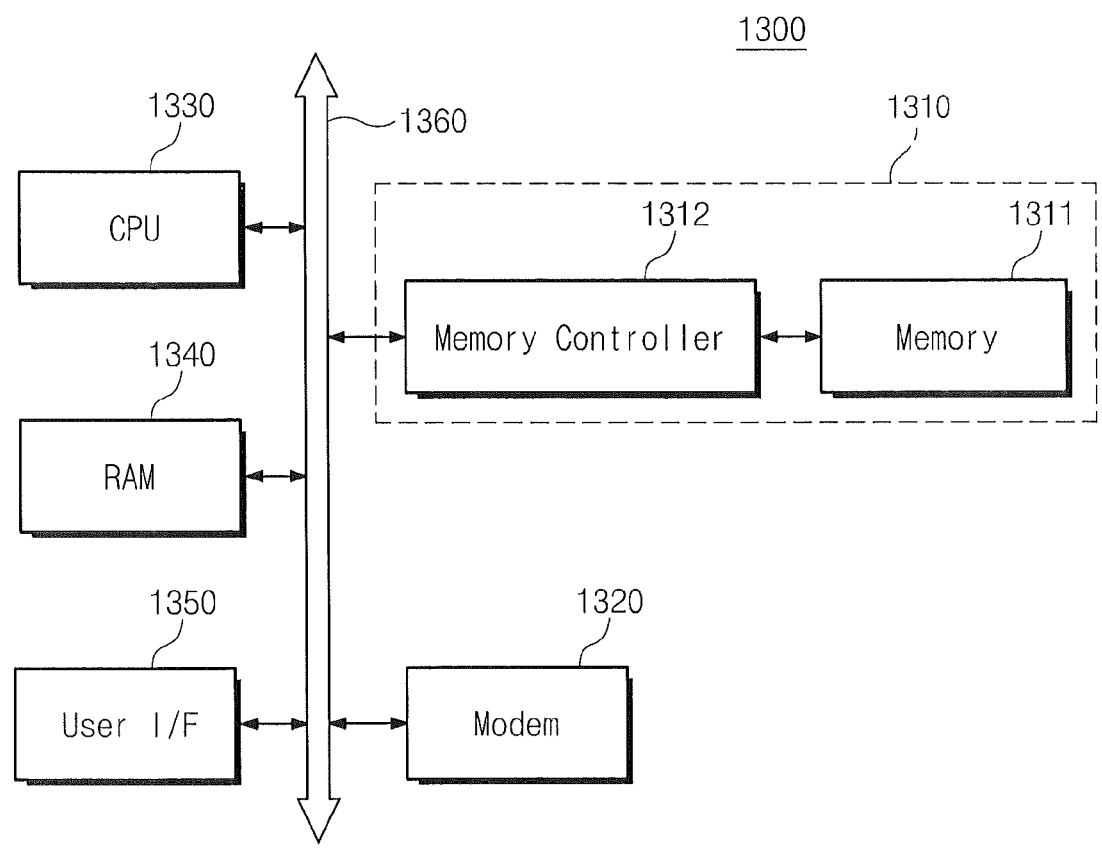
FIG. 13B is a block diagram of an information processing system including a three-dimensional semiconductor memory device according to example embodiments of the subject matter.

FIG. 13B is a block diagram of an information processing system including a three-dimensional semiconductor memory device according to example embodiments of the subject matter, Referring to FIG. 13B, an information processing system 1300 may be realized using a memory system 1310 including the three-dimensional semiconductor memory device 1 according to example embodiments of the subject matter. For instance, the information processing system 1300 may be a mobile device and/or a desktop computer. In some embodiments, the information processing system 1300 may further include a modem 1320, a central processing unit (CPU) 1330, a random access memory (RAM) 1340, and a user interface 1350, which are electrically connected to a system bus 1360, in addition to the memory system 1310. The memory system 1310 may include a memory device 1311 and a memory controller 1312. In some embodiments, the memory system 1310 may be configured substantially identical to the memory card 1200 described with respect to FIG. 13A. Data processed by the CPU 1330 and/or input from the outside may be stored in the memory system 1310. In some embodiments, the memory system 1310 may be used as a portion of a solid state drive (SSD), and in this case, the information processing system 1300 may stably and reliably store a large amount of data in the memory system 1310. Although not illustrated, it is apparent to those skilled in the art that, for example, an application chipset, a camera image sensor, a camera image signal processor (ISP), an input/output device, or the like may further be included in the information processing system 1300 according to the subject matter.

According to some example embodiments of the subject matter, a plug may be connected to a common source region, and a strapping line may be electrically connected to the plug without additional metal contact plug interposed therebetween. Accordingly, it is possible to omit several process steps for forming the additional metal contact plug and/or to reduce or prevent technical problems accompanied by the formation of the additional metal contact plug from occurring. As a result, it is possible to realize a semiconductor memory device with improved electric reliability.

While some example embodiments of the subject matter have been particularly shown and described, it will be understood by one of ordinary skill in the art that variations in form and detail may be made therein without departing from the spirit and scope of the attached claims.

What is claimed is:
1. A memory device, comprising:
a plurality of gate stacks extending in parallel on a substrate along a first direction;
a plurality of insulation regions extending along the first direction and respectively disposed between adjacent ones of the gate stacks, the insulation regions having linear first portions having a first width and widened second portions having a second width greater than the first width;
a common source region in the substrate underlying the at least one insulation region;
respective conductive plugs passing through respective ones of the widened second portions of the insulation regions and electrically connected to the common source region; and
a plurality of strapping lines disposed on the conductive plugs and extending along the first direction, respectively disposed between the adjacent ones of the gate stacks and in direct contact with the conductive plugs.

2. The device of claim 1, wherein each of the gate stacks comprises a plurality of vertical channel regions distributed along the first direction and wherein the plugs are spaced apart along the first direction.

3. The device of claim 2, further comprising at least one bit line electrically connected to the vertical channel regions and extending along a second direction perpendicular to the first direction, wherein top surfaces of the plugs are located at a level higher than top surfaces of the vertical channel regions and lower than the at least one bit line and the at least one strapping line.

4. The device of claim 3, further comprising a common source line electrically connected in common to the plurality of strapping lines.

5. The device of claim 4, wherein the common source line is disposed at the same level as the at least one bit line.

6. The device of claim 1, further comprising a barrier layer conforming to bottom and side surfaces of the at least one insulation region.

7. The device of claim 1, further comprising a plurality of bit lines electrically connected to the vertical channel regions and having bottom surfaces disposed at a level higher than top surfaces of the strapping lines.

8. The device of claim 7, wherein the bit lines extend along a second direction perpendicular to the first direction and cross over the strapping lines.

9. A memory device, comprising:
- a plurality of gate stacks extending in parallel on a substrate along a first direction, each of the gate stacks comprising a plurality of vertical channel regions;
- a plurality of insulation regions extending along the first direction and respectively disposed between adjacent ones of the gate stacks, the insulation regions having linear first portions having a first width and widened second portions having a second width greater than the first width;
- a common source region in the substrate underlying the insulation regions;
- respective conductive plugs passing through respective ones of the widened second portions of the insulation regions and electrically connected to the common source region;
- at least one bit line electrically connected to the vertical channel regions; and
- a plurality of strapping lines disposed on the conductive plugs and extending along the first direction, respectively disposed between the adjacent ones of the gate stacks,
- wherein top surfaces of the conducive plugs are located at a level higher than top surfaces of the vertical channel regions and lower than the at least one bit line.

10. The device of claim 9, further comprising a common source line electrically connected in common to the plurality of strapping lines, wherein the common source line is disposed at the same level as the at least one bit line.

11. The device of claim 9, wherein the at least one bit line extends along a second direction perpendicular to the first direction and cross over the strapping lines.

* * * * *